United States Patent [19]

Wiese

[11] Patent Number: 5,028,866
[45] Date of Patent: Jul. 2, 1991

[54] METHOD AND APPARATUS FOR MAPPING PRINTED CIRCUIT FIELDS

[75] Inventor: Richard W. Wiese, Milford, Mich.

[73] Assignee: General Motors Corporation, Detroit, Mich.

[21] Appl. No.: 530,780

[22] Filed: May 30, 1990

[51] Int. Cl.⁵ .................... G01R 21/04; G01R 31/02
[52] U.S. Cl. .......................... 324/158 F; 324/158 P; 324/95
[58] Field of Search ............... 324/158 F, 158 P, 72.5, 324/95, 158 R; 343/703; 455/67, 226, 115; 340/600, 825.34

[56] References Cited

U.S. PATENT DOCUMENTS

| | | | |
|---|---|---|---|
| 3,463,007 | 8/1969 | Jones et al. | 340/600 |
| 3,848,189 | 11/1974 | Pope | 324/95 |
| 4,354,153 | 10/1982 | Lentz | 324/95 |
| 4,565,967 | 1/1986 | Eisenbrandt et al. | 324/95 |
| 4,829,238 | 5/1989 | Goulette et al. | 324/95 |

OTHER PUBLICATIONS

"A Faster Way to Check Circuit Boards for EMI", *Electronics*, Apr. 21, 1986, pp. 24–25.
"EMSCAN: A Tool to Measure EMI Emissions from Printed Circuit Packs", *EMC Testing*, Nov.–Dec. 1989, pp. 4–5.

*Primary Examiner*—Kenneth A. Wieder
*Assistant Examiner*—Vinh P. Nguyen
*Attorney, Agent, or Firm*—Howard N. Conkey

[57] ABSTRACT

An electromechanical XY carriage sweeps a magnetic or electrical field probe across a circuit board line by line to acquire field strength data as a function of probe position relative to the board. Colored field maps are produced. The carriage is controllable to obtain very high resolution data. A magnetic probe includes a single loop oriented parallel to the board or a loop oriented perpendicular to the board and selectively parallel to or perpendicular to the x axis of the carriage. Different field maps are produced by different probe orientations and each provides information regarding the circuit traces which carry rf currents.

10 Claims, 2 Drawing Sheets

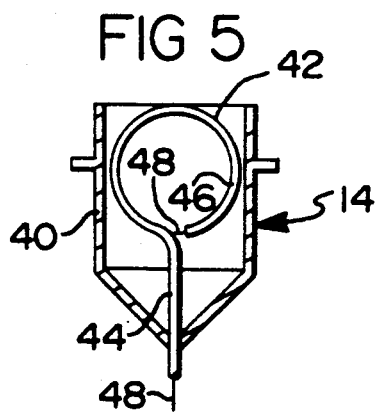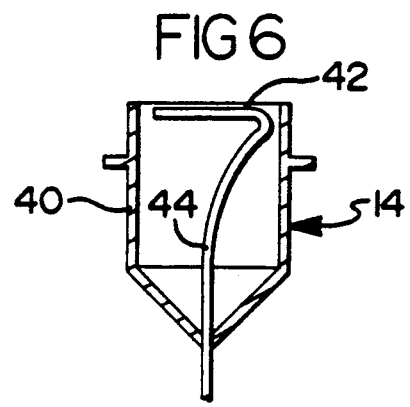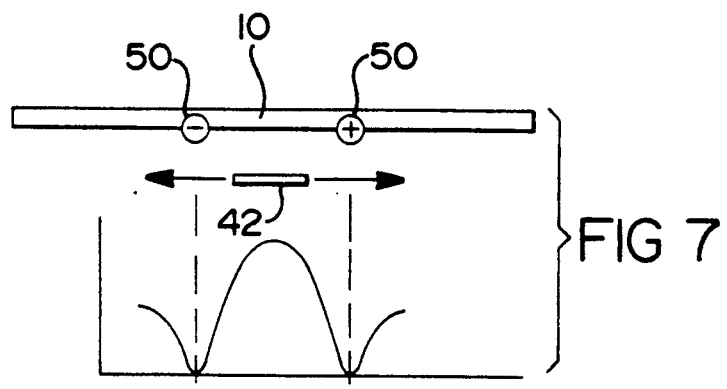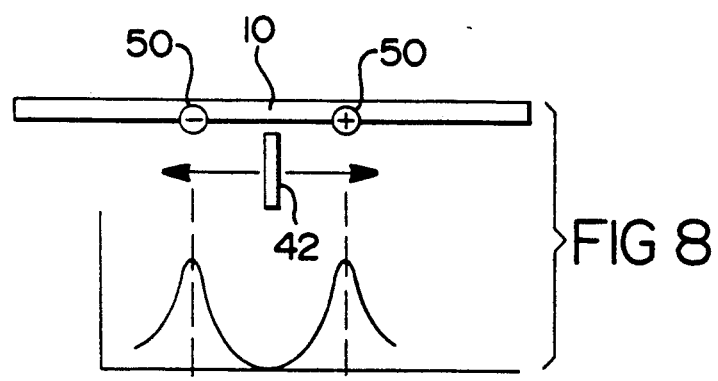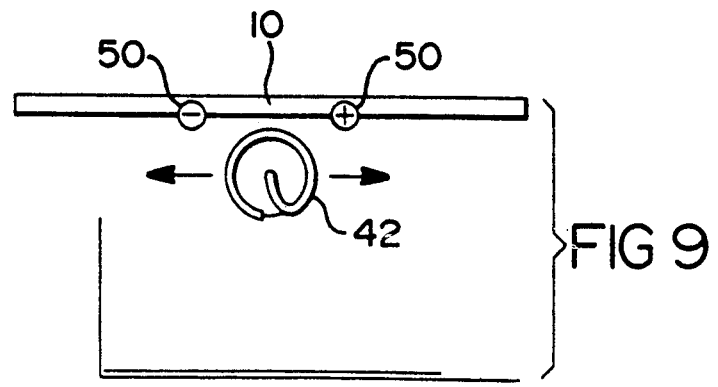

METHOD AND APPARATUS FOR MAPPING PRINTED CIRCUIT FIELDS

FIELD OF THE INVENTION

This invention relates to the analysis of fields emanating from printed circuit boards and particularly to a method and apparatus for mapping such fields.

BACKGROUND OF THE INVENTION

In automotive vehicles control circuits comprise printed circuit boards containing a harness connector, a number of components and traces or circuit paths interconnecting the components and the connector. It can occur for a particular circuit board design that radio frequency currents can be developed and carried in the traces to cause an electromagnetic field to emanate. Depending on the circuit design and the strength of the field, it can cause undesirable radio interference. This is especially true if a strong field occurs in the region of the harness connector and results in rf currents in the harness which acts as an antenna to radiate interference signals. Conversely, the harness can pick up rf energy from another source and carry rf current to the circuit board which may have adverse effects on the circuit. Such undesirable current also results in field emanation from the circuit board.

It is desirable to measure the field emanating from the printed circuit board in sufficient detail to establish the field pattern and provide an indication of where the fields are on the board and consequently what elements or traces carry the rf current. With this knowledge, it is then possible to correct any problem, say by adding a filter at an appropriate place in the circuit or even redesign the circuit to prevent the objectionable radiation. Examination of prototype circuit boards by analyzing the electromagnetic fields adjacent the board allows circuit refinement before production begins. Experience of a circuit designer with such analysis gives insight into the effect of circuit path configuration on electromagnetic emission so that initial designs can be made which avoid problems of rf radiation and susceptibility to rf fields.

It is already known to measure and map fields radiated from circuit boards. One known electromagnetic emissions scanner comprises a circuit board carrying a rectangular array of 1,280 H-field loop probes having a fixed spacing of 7.6 mm between probes. The probes are oriented in two mutually perpendicular directions to sense fields from conductors running in any direction. The scanner is positioned adjacent a printed circuit board under test so that each probe senses the magnetic field at its location. The probes are sequentially addressed by a computer to retrieve field data and a receiver or a spectral analyzer collects the data and displays the information in color according to frequency and field strength to thus map the field. This tool has the drawbacks of high cost, due to the complex scanner with many probes, and low resolution due to the large spacing between the probes. Since many circuit boards have high density circuit paths, the low resolution limits the scanner usefulness.

SUMMARY OF THE INVENTION

It is therefore an object of the invention to provide a low cost apparatus and a method for sensing circuit board emissions with high resolution.

The invention is carried out by a method of mapping an electromagnetic field emanating from a printed circuit board having components and circuit paths giving rise to such field comprising the steps of: electrically energizing the circuit on a printed circuit board to produce an electromagnetic field adjacent the circuit board, moving a sensor through the said field in a prescribed path to generate varying sensor outputs, acquiring field data by sampling the sensor outputs along the path, displaying the sampled data in accordance with strength to provide a map illustrating field strength patterns.

The invention is further carried out by apparatus for mapping the electromagnetic field emanating from a printed circuit board assembly comprising: a sensor responsive to the electromagnetic field to generate output signals representing field strength, electromechanical means supporting the sensor for scanning the sensor in a pattern passing through the field, receiver means for acquiring data represented by the output signals, and display means coupled to the receiver means for mapping the signal in a field strength pattern.

BRIEF DESCRIPTION OF THE DRAWINGS

The above and other advantages of the invention will become more apparent from the following description taken in conjunction with the accompanying drawings wherein like references refer to like parts and wherein:

FIGS. 5 and 6 are cross-sectional views of different probes used by the positioner of FIG. 2 according to the invention, and FIGS. 7, 8 9 are diagrams of different probe orientations and graphs of the resulting signals obtained for each orientation.

DESCRIPTION OF THE INVENTION

Figure 1:
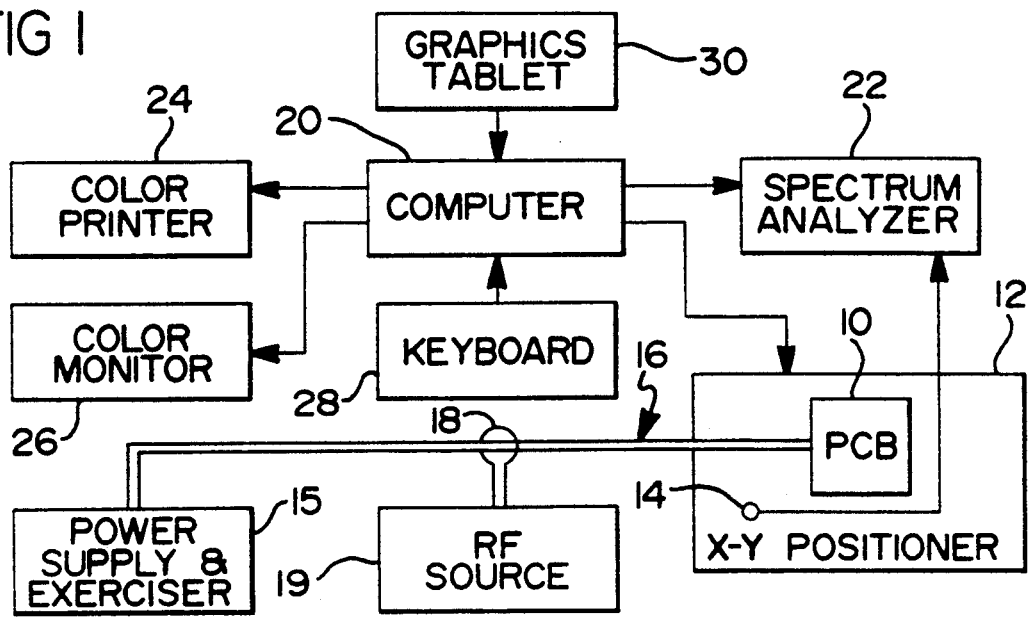
FIG. 1 is a block diagram of a system for mapping electromagnetic fields of printed circuit boards using a data acquisition device according to the invention.

A system for mapping the magnetic or electric field emitted by a printed circuit board 10 is shown in FIG. 1. An XY positioner 12 supports the circuit board 10 and carries a probe 14 sensitive to electromagnetic emissions from the board 10. A power supply and exerciser 15 is connected to the circuit board 10 through the board harness 16 to provide operating voltage and input signals to the printed circuit board. Optionally, a single loop inductor 18 coupled to the harness 16 is connected to an rf source 19 to inject into the harness 16 rf signals simulating electromagnetic interference. Thus the inductor 18 and harness 16 act as transformer primary and secondary windings, respectively. A computer 20 controls the positioner 12 to sweep the probe 14 in a controlled path across the area of the printed circuit board 10. A spectrum analyzer 22 or other receiver is coupled to the probe 14 to acquire the voltage signals developed by the probe during its traverse of the printed circuit board and is also interconnected with the computer to relay results to the computer. The computer 20 is also connected to a color printer 24 and/or a color monitor 26 to display the results. A keyboard 28 and a graphics tablet 30 are coupled to the computer for manually entering operator inputs.

The major components of the system can be acquired from many sources. As a specific example, the following items are available from Hewlett-Packard Corp.: 9000 series 300 computer, 98785A color monitor, 9827A XY pen plotter, 8566B spectrum analyzer, Paintjet (TM) color printer, and 911A graphics tablet.

Figure 2:
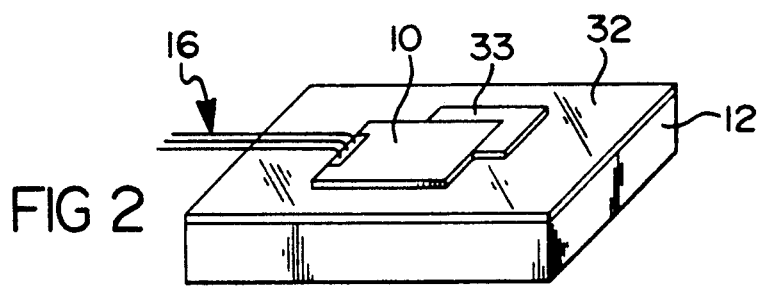
FIG. 2 is an orthometric view of an electromechanical positioner for scanning a circuit board with a sensing probe according to the invention.
Figure 3:
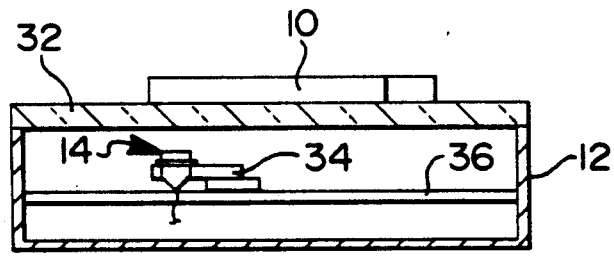
FIG. 3 is a partially sectioned view of the positioner of FIG. 2.

As shown in FIGS. 2 and 3, the XY pen plotter is modified to serve as the XY positioner 12 by covering the plotter with a transparent cover 32 such as glass or Plexiglas (TM), and substituting the probe 14 for the pen holder. The transparent cover 32 is useful in observing the probe position for entering initial probe position relative to the printed circuit board. Another scheme for setting the relative probe and board positions is an L-shaped fixture 33 fixed to the cover to positively position one corner of the printed circuit board and to angularly align the board with the positioner 12. FIG. 3 illustrates schematically that the printed circuit board 10 is supported on the glass 32, the probe 14 is held just beneath the cover 32 in the electromagnetic field by a carrier 34 which moves the probe in the Y direction and the carrier 34 in turn is mounted on a carrier 36 which moves the probe in the X direction.

Figure 4:
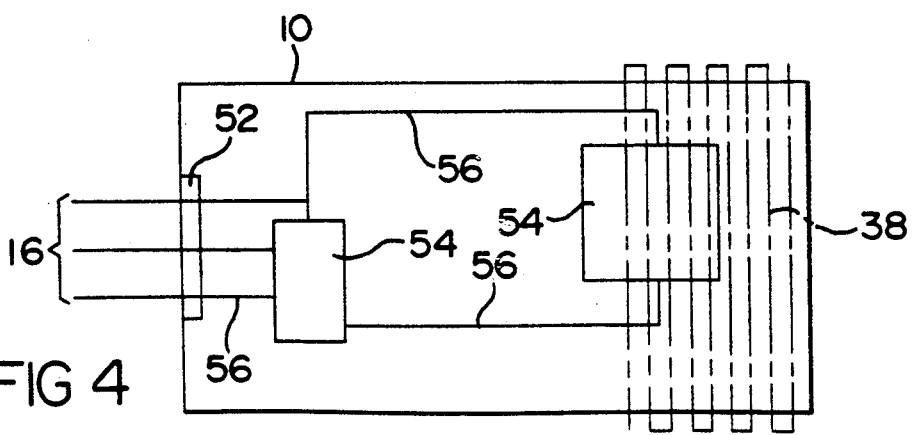
FIG. 4 is a top view of a printed circuit board with scan paths indicated.

The XY positioner 12 is able to move the probe 14 with precision about a desired path. Preferably the path is a series of spaced parallel lines 38 formed by sweeping the probe in the y direction from one side of the board to the other, indexing the probe in the x direction, sweeping the probe across the board again, and so on as shown in FIG. 4. The positioner can move the probe 14 along each line continuously with probe readings taken periodically or in discrete steps with a reading taken at each step. When discrete steps are used, the position of the probe 14 for each data point is known positively. The positioner can be moved in step sizes of 0.1 mm, 0.5 mm, 1 mm, 2 mm or 5 mm, for example, to obtain the desired resolution. The index step along the x axis is typically the same size as the chosen step size along the y axis. Since the time of scanning the board increases as the step size decreases, large step sizes are favored for obtaining an overview of the printed circuit board emission and smaller sizes are used for detailed analysis of the emission pattern. Where closely spaced circuit traces are present, the very small steps yield information which cannot be obtained from a coarse data point pattern.

The probe 14 comprises a hollowed out pen casing 40 from the XY pen plotter with a single loop 42 of coax cable 44 as shown in FIG. 5. The coax is formed into a loop with the end of the shield 46 close to but spaced from the shield at the beginning of the loop to form a gap and the end of the inner conductor 48 soldered to the shield at the beginning of the loop 42 to bridge the gap. The loop 42 is positioned vertically in the casing 40 so that the plane of the loop is perpendicular to the plane of the printed circuit board 10. FIG. 6 shows another version of the probe 14 wherein the loop 42 is positioned horizontally in the casing 40 so that the plane of the loop will be parallel to the board.

The data gathered by the probe depends on the orientation of the probe in the field. FIGS. 7, 8 and 9 show the result of scanning across a pair of conductors 50 having current flow in opposite directions. In each figure, the orientation of the loop and direction of scanning are shown along with a graph of the voltage induced in the loop through the traverse of the probe. In FIG. 7, the loop 42 is parallel to the printed circuit board 10, such that nulls are produced when the loop is aligned with each conductor 50 and a maximum voltage is generated between the conductors. With that loop orientation, conductor locations can be accurately identified since nulls produce fairly distinct signatures. This loop orientation is insensitive to conductor 50 direction. FIG. 8 shows the plane of the loop perpendicular to the board and parallel to the conductors. In that case, a voltage maximum is generated when the loop is aligned with a conductor and a minimum occurs between the conductors. FIG. 9 shows the plane of the loop 42 perpendicular to the board and to the conductors 50. No voltage is generated in this case.

The printed circuit board of FIG. 4 contains a connector 52 coupled to the harness 16 and some components 54 interconnected by circuit traces 56. Key features are identified via the graphics tablet 30 to produce an overlay useful in interpreting the field maps. A point on the graphics tablet is identified to the computer by pressing a pen on that point of the tablet. A full sized drawing or a photocopy of the circuit is placed on the graphics tablet in a location corresponding to the printed circuit board location on the XY positioner 12. Then by defining the component locations with the pen, the component's locations are stored in the computer.

The spectrum analyzer 22 is capable of collecting information from the probe 14 and segregating it according to frequency band and voltage level. When a printed circuit board is being evaluated for rf emissions at a particular frequency, the analyzer is set for a band including that frequency. The data in that frequency band will be grouped into voltage ranges for display purposes. A color is assigned to each range so that the data is then displayed either on the monitor 26 or on a hard copy produced by the printer 24 as contour maps revealing the field shape as sensed by a given probe. The component locations are superimposed on the map to provide reference locations for interpreting the contour maps.

In use, a printed circuit board 10 is located on the positioner 12 with its edges parallel to x and y axes of the positioner. The harness is energized with suitable voltages and signals to activate the circuit on the board which generates the currents in the traces 56. These currents give rise to the emissions to be measured. The computer is informed through keyboard 28 entry of the corners of the printed circuit board and the desired spacing of data points. The frequency band and voltage level bands are set on the analyzer. Then the probe is moved to the starting corner of the printed circuit board 10 and the scanning process is started. The probe is then swept along the parallel lines 38 of FIG. 4 until the whole board is scanned. The data is stored and the color contour map is generated. By changing the probe 14 or the probe orientation, and scanning the board again, three different maps are produced, each having information not on the others. Then by comparing the maps and noting the location of conductors which produce nulls and maxima, problem areas can be located and fixes can be designed.

In some cases, external electromagnetic interference sources are coupled through the harness to affect circuit operation. To evaluate the effects of such interference, the inductor 18 is energized at a desired frequency to couple rf energy into the harness and consequently into the printed circuit board 10. Then the board is scanned, as before, and maps made of the circuit emissions. Another technique of evaluating the effects of external interference is to inject rf energy into the board 10 by energizing the loop 42 with an rf current and monitoring the circuit operation for anomalies while the loop is scanned over the circuit board.

In summary, it is to be understood that an electric field probe can be used instead of the magnetic field probe to map the electric field. An electromechanical XY carriage is used to precisely move the probe about the printed circuit board. The carriage can be stepped in a discrete or continuous back and forth manner. It will be apparent that the scanner can be operated to scan the entire board or only a selected portion of it. Three orthogonal probe orientations are used to sample the field. The probe signal is proportional to the field as a function of the probe position relative to the board. A spatial profile of the field distribution about the circuit board identifies the location and intensity of radio frequency currents flowing in circuit traces. For use on printed circuit boards having traces very close together, it is necessary to rely on the precise location of a null in the magnetic field as well as a field maximum. The detection of field null is critical to the identification of individual circuit traces carrying rf currents. Hence very fine probe positioning is required. The electromechanical XY carriage assembly allows for accurate and repeatable placement of the probe relative to the printed circuit board.

The embodiments of the invention in which an exclusive property or privilege is claimed are defined as follows:

1. A method of analyzing an electromagnetic field emanating from a printed circuit board having circuit elements generating such field comprising the steps of:
   electrically energizing the circuit elements to produce an electromagnetic field adjacent the board,
   sensing the field components in a first direction along a prescribed path to generate a first set of data representing varying field strength along the path,
   sensing the field components in a second direction normal to the first direction along the said prescribed path to generate a second set of data representing varying field strength along the path,
   displaying the first and second sets of data to provide first and second maps illustrating field strength patterns, and
   comparing the patterns of the maps to determine the sources of the electromagnetic fields.

2. The method as defined in claim 1 including the steps of;
   sensing the field components in a third direction normal to the first and second directions along the said prescribed path to generate a third set of data representing varying field strength along the path, and
   displaying the third set of data to provide a third map illustrating field strength patterns, whereby all three maps are compared to determine the sources of electromagnetic fields.

3. A method of mapping an electromagnetic field emanating from a printed circuit board having components and circuit paths giving rise to such field comprising the steps of:
   electrically energizing the circuit on the printed circuit board with radio frequency energy to produce an electromagnetic field adjacent the circuit board,
   moving a sensor through said field in a prescribed path to generate varying sensor outputs by repetitively traversing the sensor parallel to an axis of the board and indexing the sensor in a direction normal to the axis after each traverse to cover the board area,
   acquiring field data by sampling the sensor outputs along the path,
   displaying the sampled data in accordance with strength to provide a map illustrating field strength patterns.

4. A method of mapping an electromagnetic field emanating from a printed circuit board having components and circuit paths giving rise to such field comprising the steps of:
   electrically energizing the circuit on a printed circuit board with radio frequency energy to produce an electromagnetic field adjacent the circuit board,
   moving a directional magnetic field sensor oriented for sensitivity to magnetic field components normal to the board surface through said field in a prescribed path to generate varying sensor outputs,
   acquiring field data by sampling the sensor outputs along the path,
   displaying the sampled data in accordance with strength to provide a map illustrating field strength patterns.

5. The method as defined in claim 4 including the step of superimposing an outline of the components on the map.

6. The method of claim 4 including the step of limiting the acquired field data to a given frequency range whereby the map represents the field strength distribution for said field range.

7. A method of mapping an electromagnetic field emanating from a printed circuit board having components and circuit paths giving rise to such field comprising the steps of:
   electrically energizing the circuit on the printed circuit board with radio frequency energy to produce an electromagnetic field adjacent the circuit board,
   moving a directional magnetic field sensor through said field in a prescribed path that is a series of parallel straight lines spaced across the area of the circuit board to generate varying sensor outputs, said sensor being oriented for sensitivity to magnetic field components normal to said straight lines and parallel to the board surface,
   acquiring field data by sampling the sensor outputs along the path,
   displaying the sampled data in accordance with strength to provide a map illustrating field strength patterns.

8. A method of mapping an electromagnetic field emanating from a printed circuit board having components and circuit paths giving rise to such field comprising the steps of:
   electrically energizing the circuit on the printed circuit board with radio frequency energy to produce an electromagnetic field adjacent the circuit board,
   moving a directional magnetic field sensor through said field in a prescribed path that is a series of parallel straight lines spaced across the area of the circuit board to generate varying sensor outputs, said sensor being oriented for sensitivity to magnetic field components parallel to said straight lines.
   acquiring field data by sampling the sensor outputs along the path, displaying the sampled data in accordance with strength to provide a map illustrating field strength patterns.

9. A method of mapping an electromagnetic field emanating from a printed circuit board connected to a harness and having components and circuit paths giving rise to such field comprising the steps of:
electrically energizing the circuit on the printed circuit board with radio frequency energy to produce an electromagnetic field adjacent the circuit board by inductively coupling radio frequency energy into the harness to simulate the effect of external radio frequency fields on the circuit board,
moving a sensor through said field in a prescribed path to generate varying sensor outputs,
acquiring field data by sampling the sensor outputs along the path,
displaying the sampled data in accordance with strength to provide a map illustrating field strength patterns.

10. Apparatus for mapping the electromagnetic field emanating from a printed circuit board connected to a harness comprising:
inductor means for coupling radio frequency energy into the harness to cause said field to emanate from the printed circuit board,
a sensor responsive to the electromagnetic field to generate output signals representing field strength,
electromechanical means supporting the sensor for sweeping the sensor in a pattern passing through the field,
receiver means for acquiring data represented by the output signals, and
display means coupled to the receiver means for mapping the signal in a field strength pattern.

* * * * *